United States Patent
Ito et al.

(10) Patent No.: US 6,240,632 B1
(45) Date of Patent: *Jun. 5, 2001

(54) METHOD OF MANUFACTURING LEAD FRAME AND INTEGRATED CIRCUIT PACKAGE

(75) Inventors: Makoto Ito; Kenji Ohsawa, both of Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/716,073

(22) Filed: Sep. 19, 1996

(30) Foreign Application Priority Data

Sep. 22, 1995 (JP) .................................. 7-244821

(51) Int. Cl.7 .................................................. H01R 43/00
(52) U.S. Cl. ................................ 29/827; 29/884; 216/14; 257/666

(58) Field of Search ........................ 29/827, 884; 216/14; 361/813; 437/220; 174/254, 257, 52.4, 261; 257/666, 758, 672, 677; 438/128

(56) References Cited

U.S. PATENT DOCUMENTS

| | | | |
|---|---|---|---|
| 5,221,428 | * | 6/1993 | Ohsawa et al. .................. 29/827 |
| 5,369,220 | * | 11/1994 | Harada et al. .................. 174/257 |
| 5,426,850 | * | 6/1995 | Fukotomi et al. .................. 29/848 |
| 5,481,798 | * | 1/1996 | Ohsawa et al. .................. 29/827 |
| 5,661,086 | * | 8/1997 | Nakashima et al. .................. 29/827 |

* cited by examiner

Primary Examiner—Lee Young
Assistant Examiner—Rick Kiltae Chang
(74) Attorney, Agent, or Firm—Sonnenschein, Nath & Rosenthal

(57) ABSTRACT

According a method of manufacturing a lead frame of the present invention, a plurality of leads each having an inner lead portion and an outer lead portion are formed on a metal base having on its surface a nickel layer by copper plating. An insulative holding film for holding each of the leads is formed. A projecting electrode is formed on the outer lead portion. Respective leads are separated by selectively removing the metal base by etching.

9 Claims, 15 Drawing Sheets

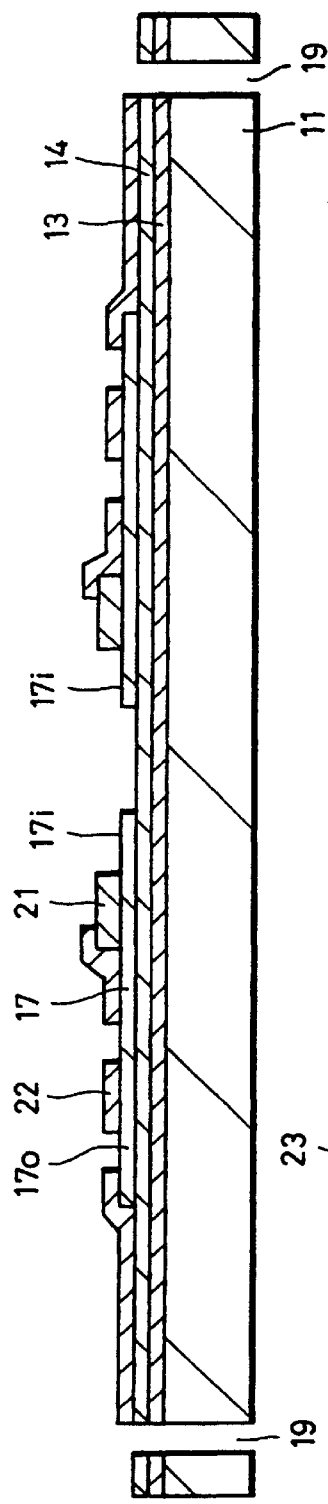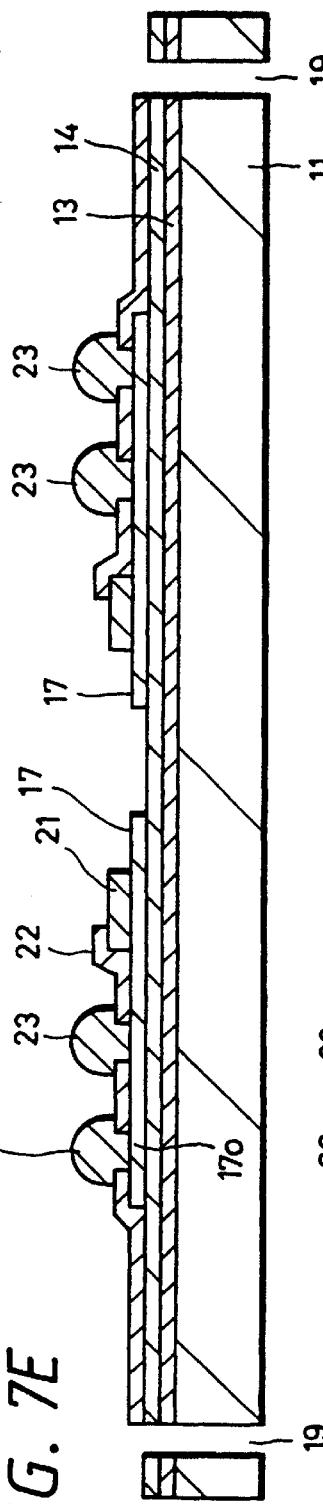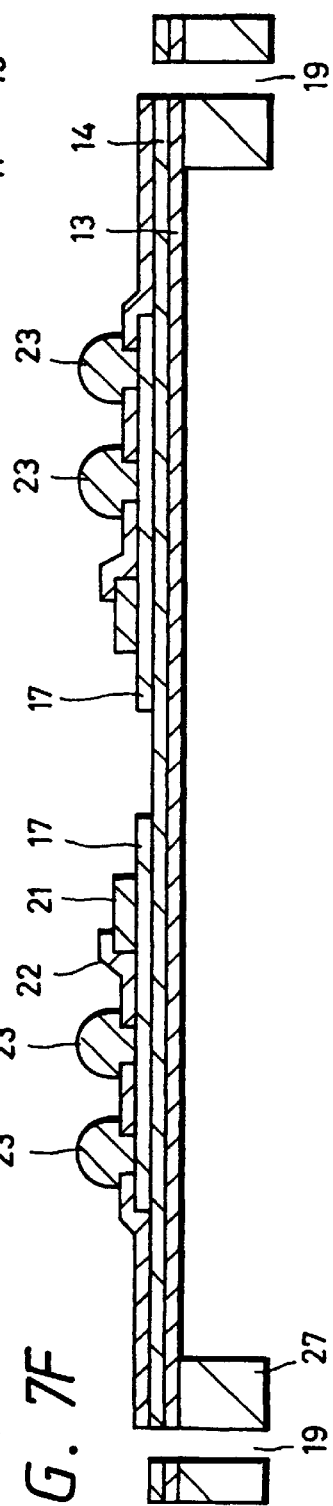

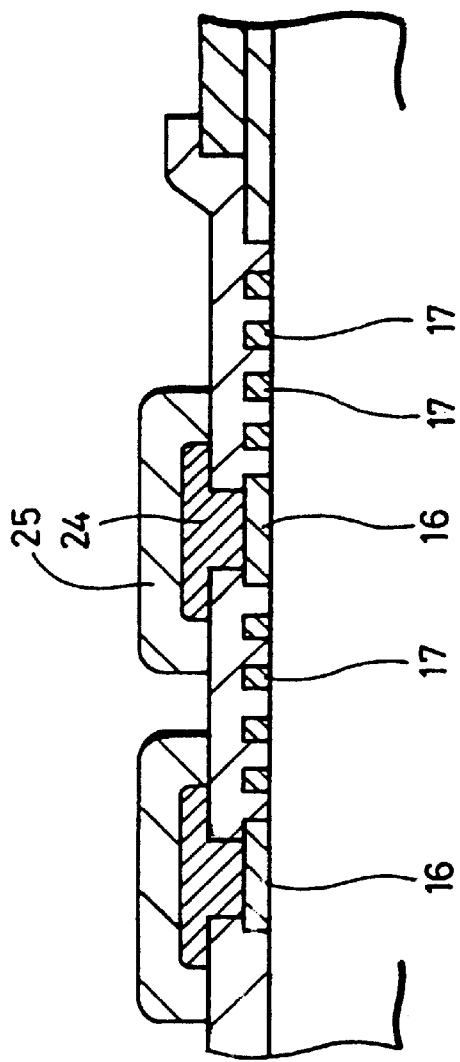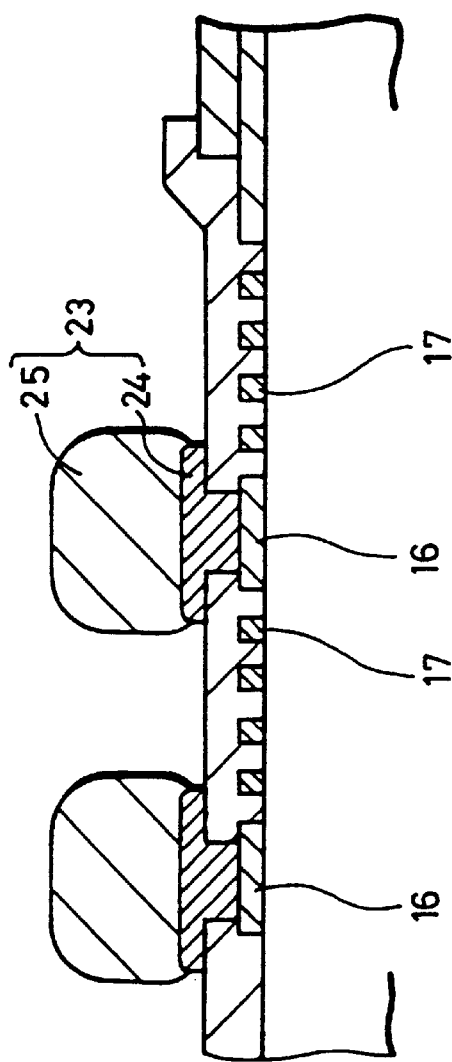
FIG. 11A
FIG. 11B

METHOD OF MANUFACTURING LEAD FRAME AND INTEGRATED CIRCUIT PACKAGE

BACKGROUND OF THE INVENTION

Field of the Invention

The present invention relates to a method of manufacturing a lead frame and an integrated circuit package having a structure with pins of a very large number in which the above lead frame is bonded to a semiconductor chip.

Description of the Related Art

The present invention relates to a semiconductor device having a structure with pins of the very large number obtained by joining a new lead frame to a semiconductor chip, and a method of manufacturing the semiconductor device.

Description of the Related Art

FIG. 1 is a cross-sectional view showing a semiconductor device, i.e., an integrated circuit package in which a semiconductor chip can be connected to a circuit board or the like through an organic substrate having a projecting electrode such as a solder ball.

In FIG. 1, an organic multilayer circuit board a having about two to six layers formed of an organic material is mounted on its surface with a semiconductor chip b. An electrode of the semiconductor chip b and a wiring film c formed on the surface of the organic multilayer circuit board a are connected to each other by wire bonding employing metal wires d or the like.

A solder ball e is provided on a rear surface of the organic multilayer circuit board a and serves as a projecting electrode electrically connected through a through hole i to the wiring film c on the surface of the organic multilayer circuit board a. The solder ball e is faced to the outside through an opening of a solder resist film f. The semiconductor chip b together with the metal wire d are sealed by a sealing resin g.

An integrated circuit package j is formed such that the solder balls e formed on the rear surface of the organic multilayer circuit board a is connected to a circuit board h. Being provided with a large number of solder balls e arranged in a grid fashion, the organic multilayer circuit board a is often called a ball grid array (BGA). The integrated circuit package j employing the organic multilayer circuit board a is called a BGA package.

The BGA package j employs the wire bonding to connect the electrode of the semiconductor chip b with the wiring film c of the organic multilayer circuit board a. Therefore, this arrangement limits reduction of a pitch between electrode pads of the semiconductor chip b.

Moreover, since a processing for forming the projecting electrodes e of the organic multilayer circuit board a employs a method of physically locating the so-called solder balls, the processing encounters the following problems.

1) When the solder balls e are set at predetermined positions, they are easily displaced therefrom.

2) Since the sizes of the solder balls e are selected by using a sieve or a mesh, the sizes thereof tends to be uneven.

3) There is a limit in achievement of a more minute arrangement pitch between the solder balls e.

4) Since a base of the organic multilayer circuit board a is formed of an insulative substrate, the solder balls e cannot be formed by electroplating which allows the sizes of the solder balls e to be uniform in size and allows pitches therebetween to be more minute.

5) Composition of the soft solder ball is restricted.

The assignee of the present invention proposed an integrated circuit package having a structure with pins of a very large number obtained by jointing a new lead frame to a semiconductor chip. A method of manufacturing the above integrated circuit package is disclosed in an application filed by the same assignee (U.S. Ser. No. 08/561,245 filed on Nov. 21, 1995). The integrated circuit package is manufactured as follows. Specifically, a large number of leads are formed on a surface of a metal base by copper electrolytic plating. An insulative film for holding each of the leads is formed at portions other than an inner lead portion. A solder resist film is further formed. A projecting electrode is formed by electrolytic plating at an end portion of an outer lead portion of each of the leads. Then, the metal base is selectively removed except its outer peripheral joint portion, thereby a lead frame having each of the lead portions separately formed is achieved. A semiconductor chip is joined to an inner lead frame portion of the lead frame. Then, a reinforcement board is bonded to a rear surface of the outer lead portion of the lead frame. The semiconductor chip is sealed with resin. Then, the lead frame is cut at its joint portions to obtain the lead frame. A large number of projecting electrodes are formed in a grid fashion at a peripheral portion around the semiconductor chip.

According to this integrated circuit package, since the metal base is employed and the leads and the projecting electrodes are formed by electroplating, the leads can be formed in a finer pattern and the projecting electrodes can be prevented from being displaced. Moreover, the size of each of the projecting electrodes can be made uniform and the finer pitches therebetween can be achieved, which enables a large-scale integrated circuit (LSI) to be more downsized and to have pins of the very large number.

As shown in FIG. 2, a metal base 1 includes a substrate 2 made of copper or copper alloy, an aluminum film 3 serving as an etching barrier or stopper film, and a thin copper film 4 serving as a ground for copper plating. The substrate 2, the aluminum film 3 and the thin copper film 4 are laminated successively.

When the metal base 1 is selectively etched, the copper substrate 2 is initially etched, the aluminum film 3 is successively etched, and then the thin copper film 4 is etched, thereby copper leads being separated. Therefore, the metal base 1 may encounter the following problems.

(i) In a process of etching the thin copper film 4, the copper lead is also etched and consequently has a small line width and a small thickness of its inner lead portion in a fine pattern as compared with their standards. As shown in FIGS. 3A and 3B which are photographs for evaluation, when the metal base 1 is etched to form the leads at a pitch of 70 μm (a standard lead width of 40 μm and standard pitch between the leads of 30 μm), a line width of an inner lead portion of the lead becomes smaller than the standard. Specifically, the lead satisfying the standard is hardly obtained.

(ii) Since the leads are formed in a fine pattern, the copper film 4 which is not removed by etching tends to remain between the adjacent inner lead portions, thereby short-circuiting the adjacent inner lead portions.

(iii) When the copper film 4 is etched, study of FIGS. 3A and 3B which are photographs for evaluation reveals that a work control margin is very narrow. Specifically, if an etching time is even a little longer, then the lead becomes narrow in the line width, and if the etching time is too short, there remains the copper film 4 which is not removed by etching.

(iv) Since the ground copper film 4 and the copper lead have the same color, the over-etching tends to be carried out when the copper film 4 is etched.

(v) The thickness of the ground copper film 4 must be set to 1 to 2 µm, thereby the etching condition being severe.

SUMMARY OF THE INVENTION

In view of such aspects, it is an object of the present invention to provide methods of manufacturing a lead frame and an integrated circuit package which prevent a solder resist film from being peeled off and can make sizes of projecting electrodes uniform.

According to a first aspect of the present invention, in a method of manufacturing a lead frame, a plurality of leads each having an inner lead portion and an outer lead portion are formed on a metal base having on its surface a nickel layer with leads formed of copper plating. An insulative holding film for holding each of the leads is formed. A projecting electrode is formed on the outer lead portion. Respective leads are separated by selectively removing the metal base by etching.

According to a second aspect of the present invention, in a method of manufacturing an integrated circuit package, a plurality of leads each having an inner lead portion and an outer lead portion are formed on a metal base having a surface of a nickel layer with leads formed of copper plating. An insulative holding film for holding each of the leads is formed. A projecting electrode is formed on the outer lead portion. Respective leads are separated by selectively removing the metal base by etching. A semiconductor chip is jointed to the inner lead portion.

BRIEF DESCRIPTION OF THE DRAWINGS

FIGS. 7D to 7F are diagrams showing processes of the method of manufacturing the integrated circuit package according to the embodiment of the present invention;

FIGS. 11A and 11B are diagrams showing processes of forming a projecting electrode according to the embodiment of the present invention;

DESCRIPTION OF THE PREFERRED EMBODIMENT

Methods of manufacturing a lead frame and an integrated circuit package according to an embodiment of the present invention will hereinafter be described with reference to the accompanying drawings.

Figure 1:
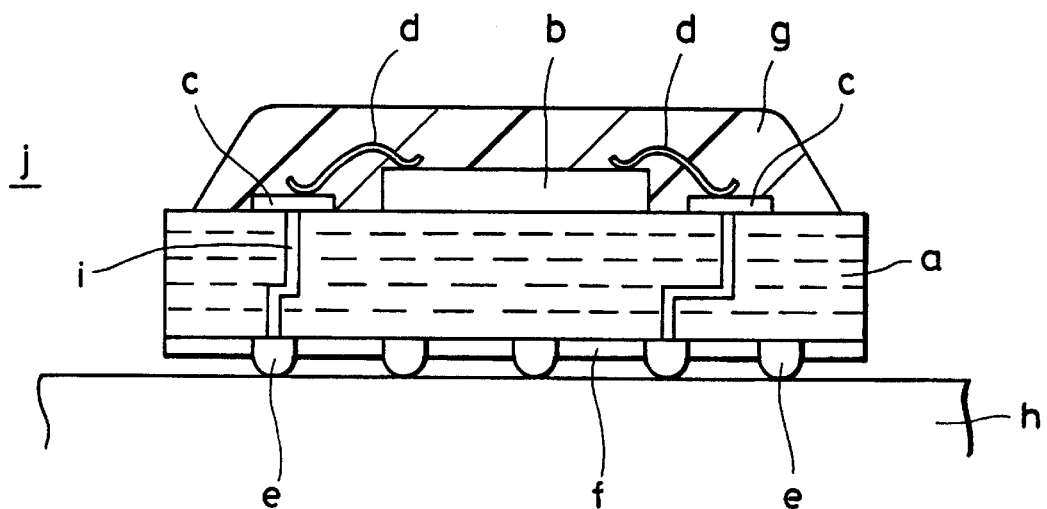
FIG. 1 is a cross-sectional view showing an integrated circuit package.
Figure 2:
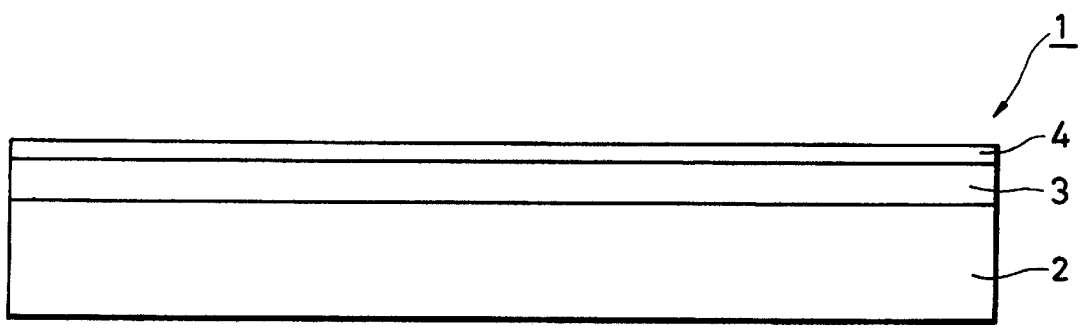
FIG. 2 is a cross-sectional view showing a metal base used in the integrated circuit package shown in FIG. 1.
Figure 3A:
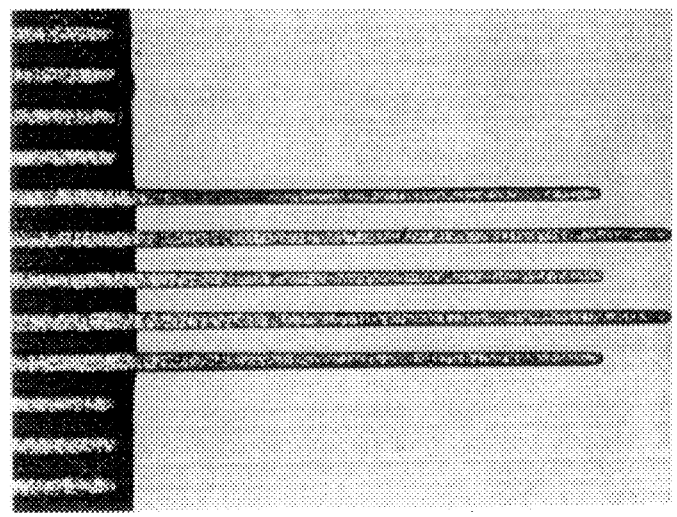
FIGS. 3A and 3B are respectively a photograph showing a fine lead pattern formed on a substrate of the integrated circuit package shown in FIG. 1 and an enlarged photograph thereof.
Figure 3B:
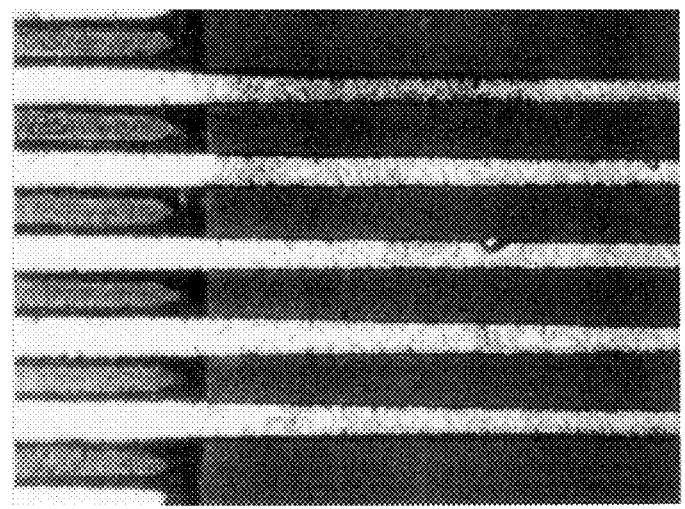
Figure 4:
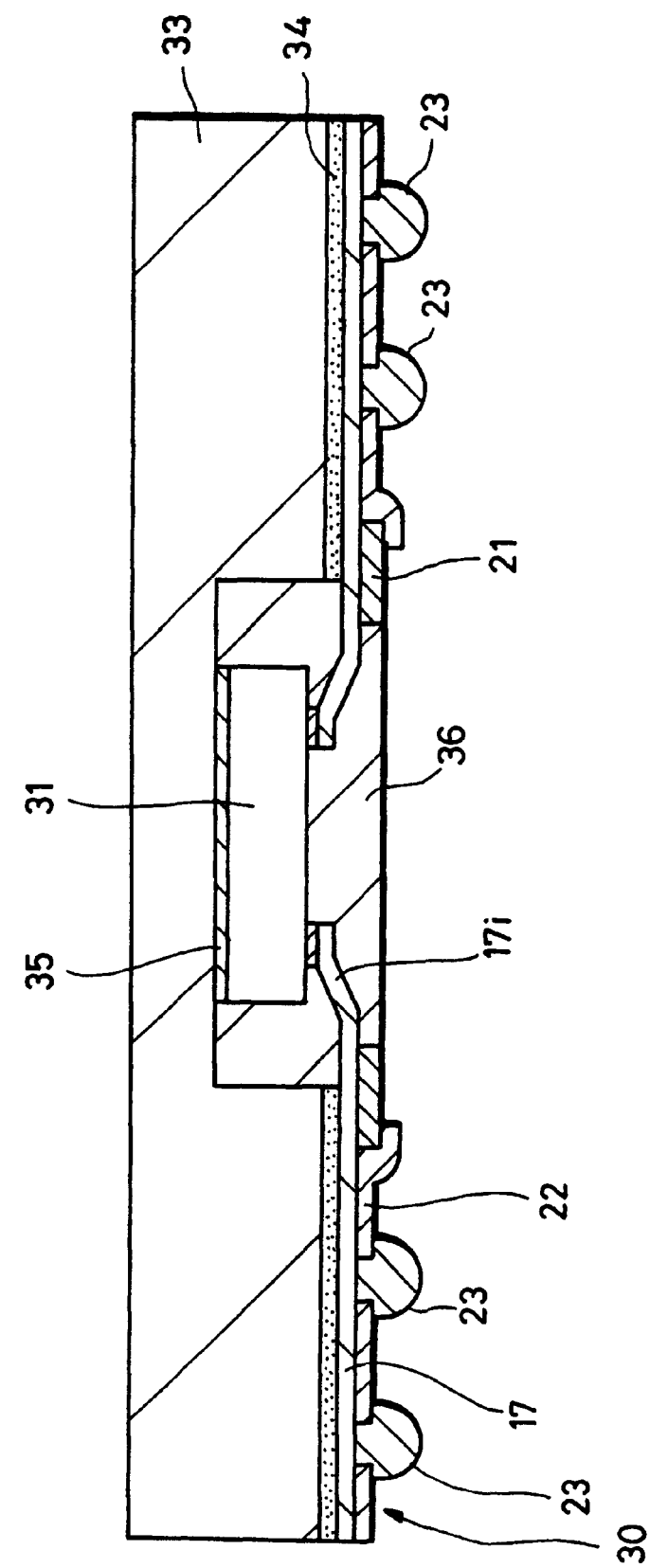
FIG. 4 is a cross-sectional view showing an integrated circuit package according to an embodiment of the present invention.
Figure 5:
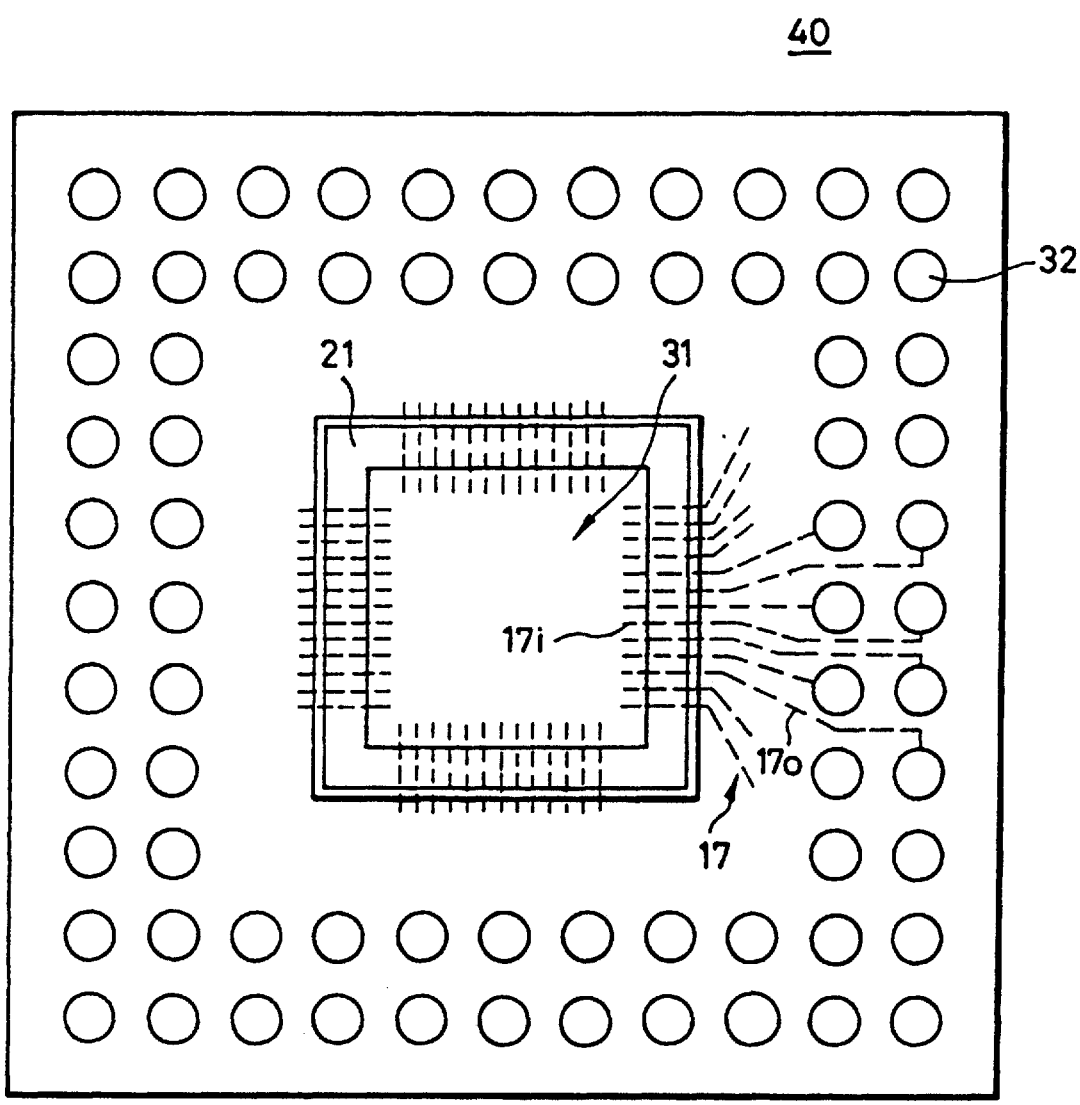
FIG. 5 is a plan view showing an integrated circuit package according to the embodiment f the present invention.

FIGS. 4 and 5 are respectively cross-sectional and plan views showing an integrated circuit package finally obtained by the method according to this embodiment. FIGS. 6A to 6C, 7D to 7F and 8G to 8I are diagrams showing the processes of manufacturing the integrated circuit package according to the embodiment of the present invention.

Figure 6A:
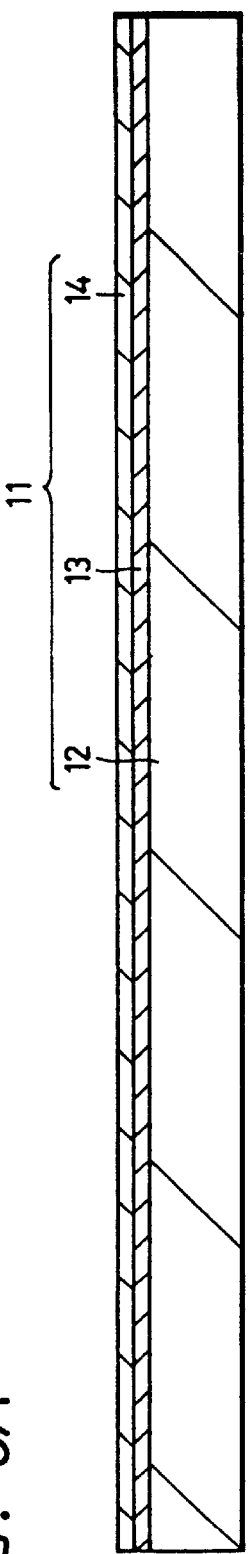
FIGS. 6A to 6C are diagrams showing processes of a method of manufacturing an integrated circuit package according to an embodiment of the present invention.
Figure 12:
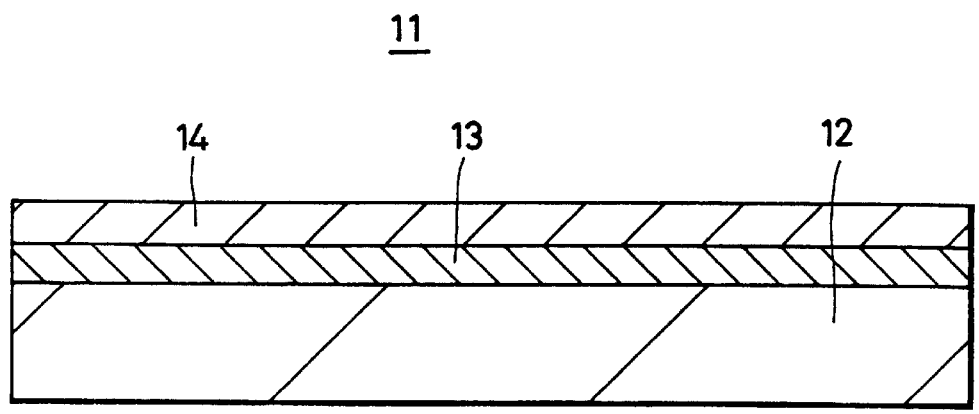
FIG. 12 is a cross-sectional view showing a metal base according to the he present invention.

In this embodiment, as shown in FIG. 6A, a metal base 11 is prepared initially. The metal base 11, as shown in FIG. 12 which is an enlarged diagram thereof, is a laminated plate having a trilayer structure formed of a thin plate 12 (hereinafter referred to as a copper substrate 12) made of copper or copper alloy with its thickness of about 150 µm, for example, an aluminum film 13 formed by evaporation on a surface of the copper substrate 12 with its thickness of about 4.5 µm, for example, and a nickel film 14 with its thickness of about 4 µm, for example, formed on a surface of the aluminum film 13. The nickel film 14 is formed by evaporation and electric plating.

The aluminum film 13 serves as an etching barrier or stopper film which prevents a surface side of the metal base 11 from being etched away when the copper substrate 12 is etched. The nickel film 14 serves as a ground carried out upon copper plating for forming a lead, has an etching selectivity relative to the lead upon etching the nickel film 14, and is used for forming a bump at a head end of an inner lead portion of the lead.

The metal base 11 will not serve as the lead by itself and hence finally becomes unnecessary. However, the metal base 11 is transiently required as a substrate when the very thin lead is formed, and as a lead frame thereafter, and hence serves as a so-called lead forming substrate.

Figure 6B:
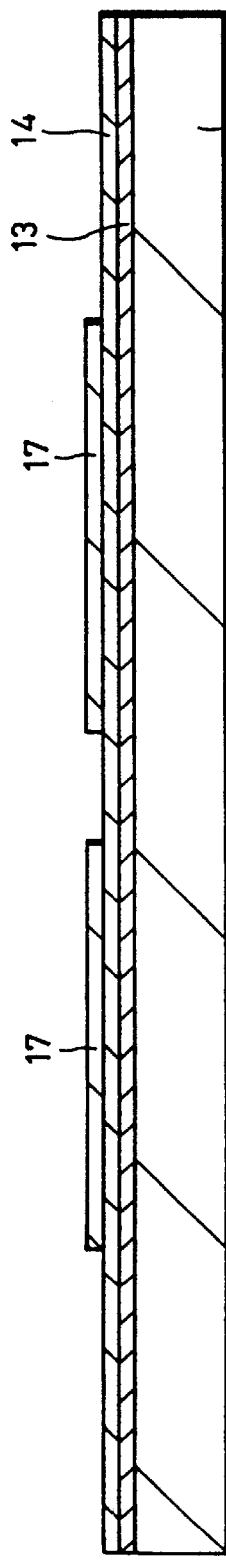
Figure 9:
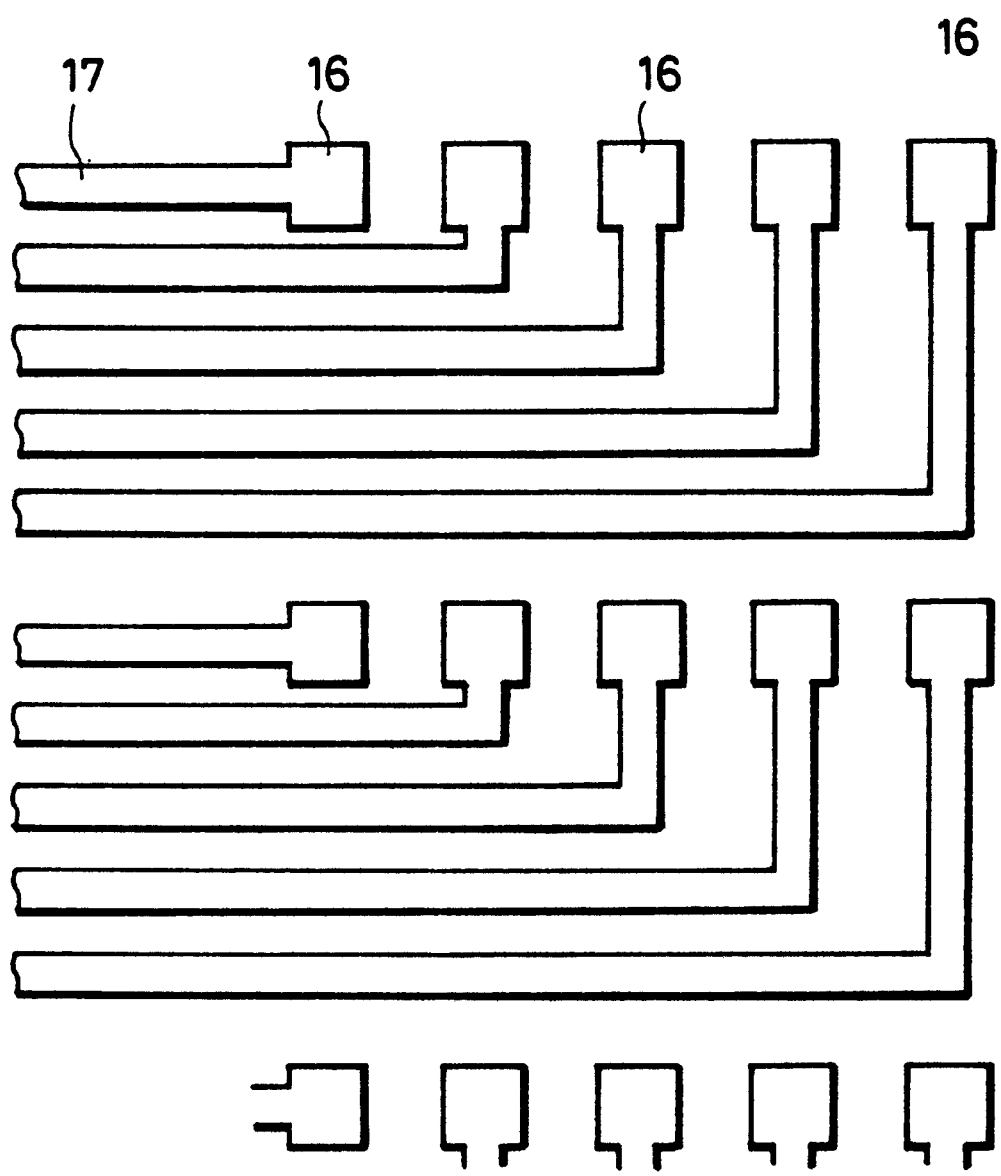
FIG. 9 is a plan view showing a pattern of a lead and a pad portion of the integrated circuit package obtained in the process shown in FIG. 6B.

As shown in FIGS. 6B and 9, a large number of leads made of copper, i.e., a large number of leads 17 integrally having pad portions 16 used for forming projecting electrodes 23 (i.e., solder balls) at their head ends are formed by selective plating on a surface of the metal base 11, i.e., on a surface of the nickel film 14.

The leads 17 of a large number are formed so as to be extended in all the directions with corresponding to the projecting electrodes formed on all the sides of a semiconductor chip 31. The pad portions 16 formed on the head ends of the leads 17 are formed on the outer periphery of the leads 17 in a grid fashion.

Figure 6C:
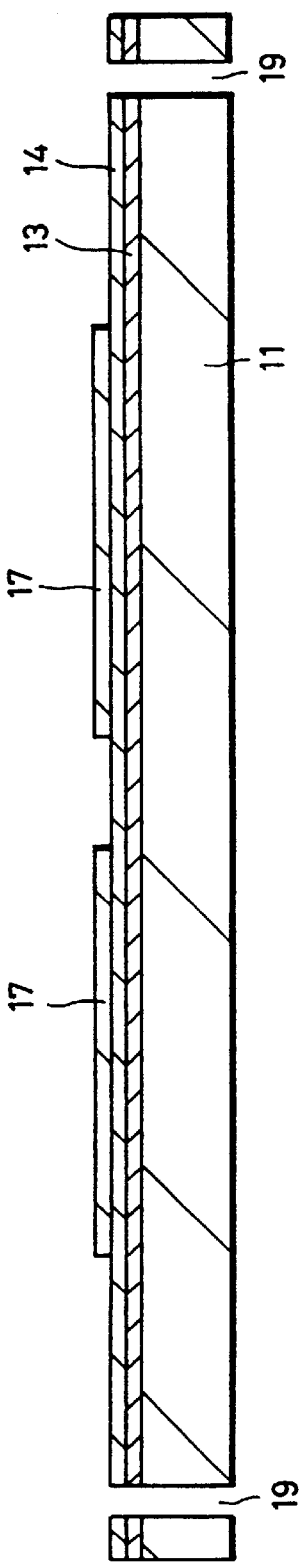

In FIGS. 6A to 6C, the pad portions 16 (not shown) are arranged in only two lines for simplification, but in FIG. 9, the pad portions 16 are arranged in five lines as practically arranged.

In the above selective plating, a surface of the nickel film 14 is selectively covered with a resist film or the like and electrolytic plating is carried out with the resist film being employed as a mask therefor. Thus, when copper is selectively plated on the metal base 11 by electrolytic plating, it is possible to form the leads 17 in a fine pattern with increasing their satisfactory film qualities. In this case, each of the leads 17 is formed with its thickness of 25 μm and its width of 35 μm and at a pitch of 70 μm, for example.

As shown in FIG. 6C, apertures 18 (see FIG. 10) for easily fabricating the integrated circuit package and slits 19 used for determining a size of the lead frame with respect to every semiconductor chip are formed at side edge portions of the metal base 11 by selective etching.

As shown in FIG. 7D, on the surface of the metal base 11 where the leads 17 are formed, an insulating film for finally holding the respective leads 17, e.g., a polyimide film 21 is laminated over positions between inner lead portions 17i and outer lead portions 17o of the respective leads 17. The polyimide film 21 is formed so as to have a shape of a rectangular frame as shown in FIG. 5.

A solder resist film 22 is deposited entirely on the surface of the metal base 11 except for the inner lead portions 17i and the pad portions 16 of the outer lead portions 17o.

Figure 10:
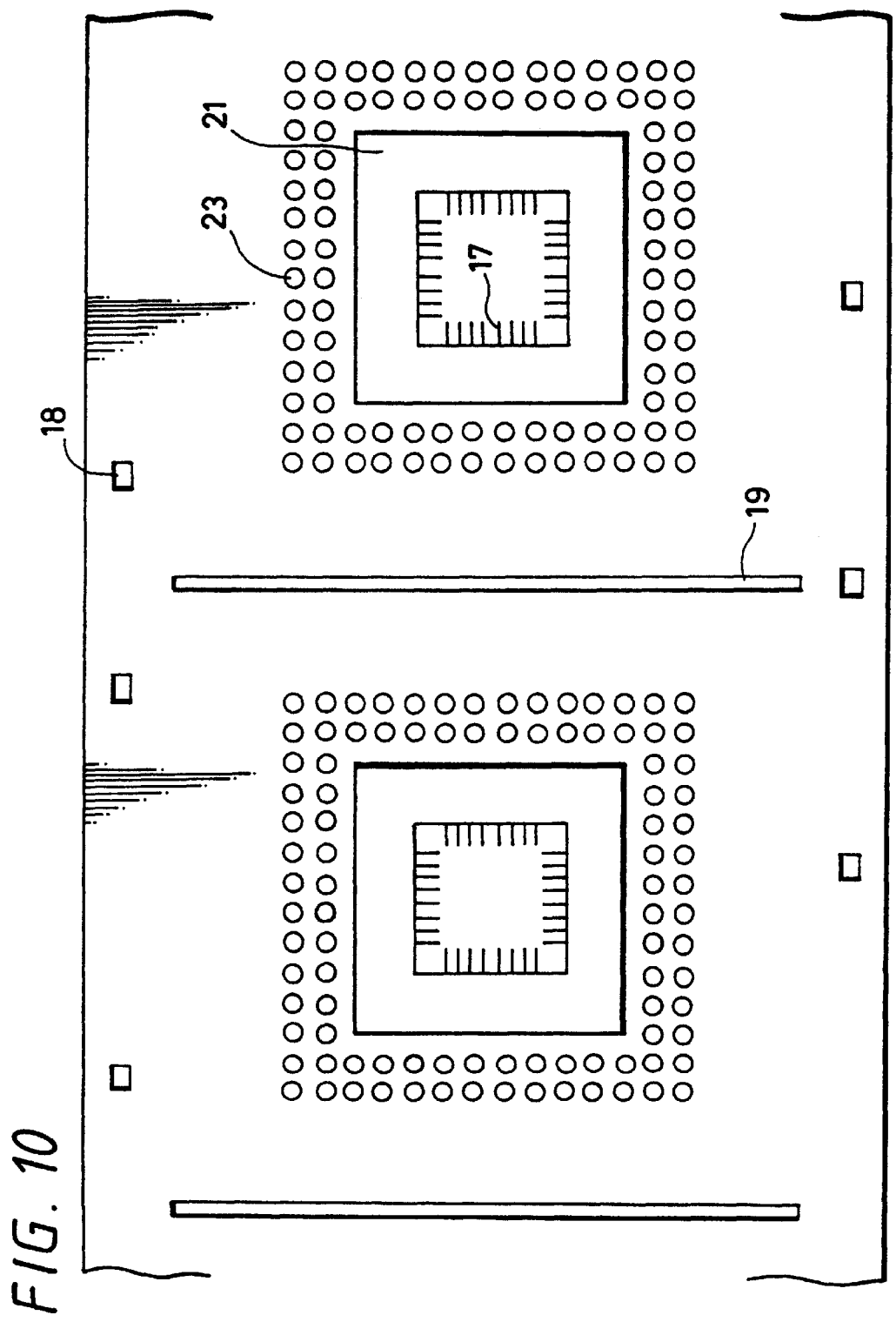
FIG. 10 is a plan view showing the integrated circuit package obtained in the shown in FIG. 7E.

As shown in FIGS. 7E and 10, projecting electrodes 23 formed of solder balls are formed by plating on the pad portions 16 at the head end of the outer lead portions 17o of the respective leads 17.

As shown in FIG. 11A, metal ground films 24 made of, for example, copper (Cu), nickel (Ni), gold (Au) or the like are formed on the copper pad portions 16 by electrolytic plating. Solder portions 25 made of SnPb alloy are respectively formed on the ground films 24 by electrolytic plating. Then, the solder portions 25 are subjected to reflowing, thereby being formed so as to be ball-shaped as shown in FIG. 11B. Thus, the projecting electrodes 23 are formed.

Each of the ground films 24 is formed on not only the pad portion 16 and but also on both-side edge portions of the solder resist film 22, i.e., formed so as to have a wider area a compared with that of the pad portion 16. The ground film 24 serves as a substantial pad portion used for forming the projecting electrode 23, i.e., the solder ball 25.

The ground film 24 may be made of SnPb alloy, the solder portion 25 having the same composition being formed thereon to obtain the solder ball. However, it is better to employ copper, nickel or the like in consideration of satisfactory bond of the ground film 24 to the pad portion 16.

As shown in FIG. 7F, the copper substrate 12 of the metal base 11 is removed by selective etching except its outer peripheral joint portion 27. When this etching is carried out, the aluminum film 13 serves as the etching barrier and allows only the copper substrate 12 to be etched away.

An etchant for etching copper has a composition shown on the following Table 1.

TABLE 1

| composition of the etchant for etching copper | |
|---|---|
| hydrogen peroxide | 12% |
| sulfuric acid | 12% |
| water | 76% |

Figure 8G:
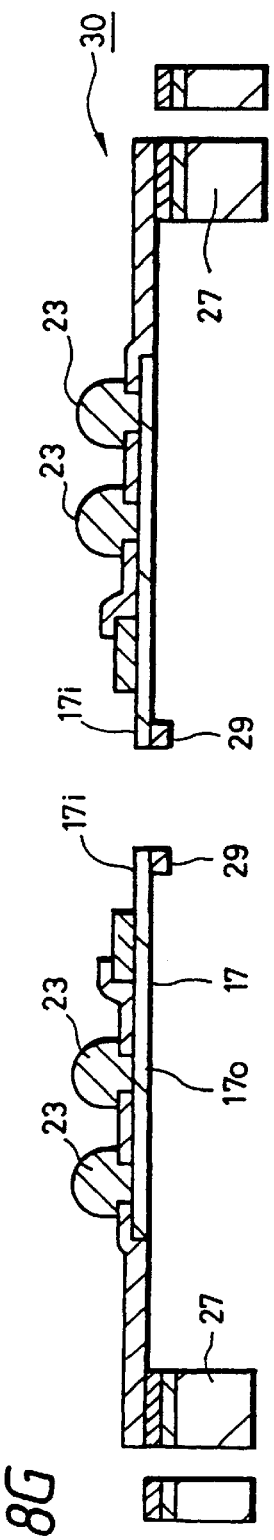
FIGS. 8G to 8I are diagrams showing processes of the method of manufacturing he integrated circuit package according to the embodiment of the present invention.

As shown in FIG. 8G, the aluminum film 13 and then the nickel film 14 of the metal base 11 are removed by selective etching to separate the respective leads 17. When the nickel film 14 is etched, the selective etching is carried out so that bumps 29 should be left at the head ends of the inner lead portions 17i.

A phosphoric acid solution is employed as an etchant for the aluminum film 13.

A mixture solution obtained by mixing a sulfuric acid etchant with a hydrogen peroxide is employed as an etchant for the nickel film 14.

In this state, the outer peripheral joint portions 27 formed of the metal base 11 are held by the solder resist film 22. Thus, a lead frame 30 having a large number of leads 17, the projecting electrodes 23 formed on the ends of the outer lead portions 17o of the leads 17 is formed.

Figure 8H:
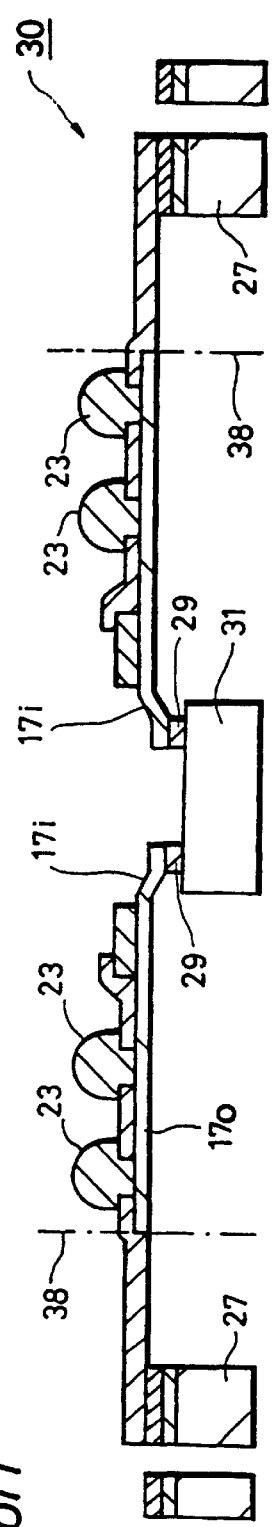

As shown in FIG. 8H, a semiconductor chip 31 is jointed to the lead frame 30. Specifically, the bump 29 at the head of each of the inner lead portions 17i is connected directly to an electrode of the semiconductor chip 31.

Figure 8I:
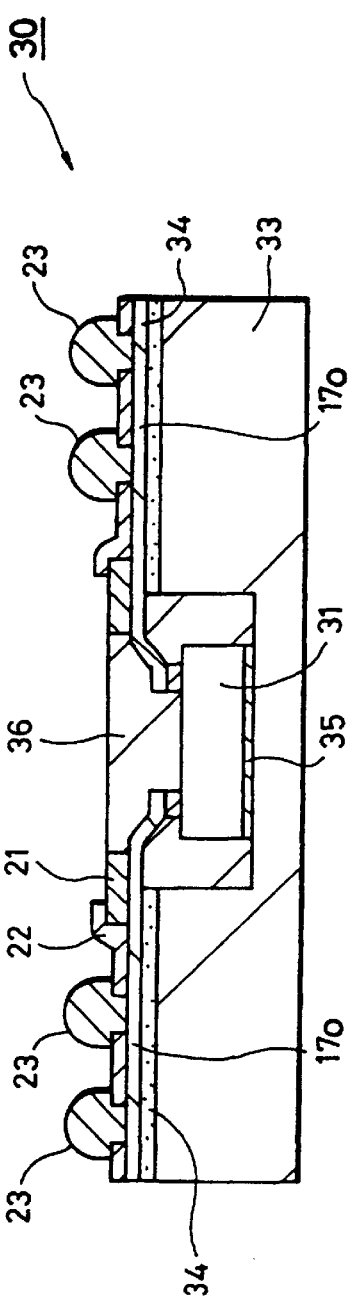

As shown in FIG. 8I, a reinforcement plate 33 having a concave-shaped cross section for housing the semiconductor chip 31 therein, a rigid aluminum plate in this embodiment is bonded to a rear surface of the lead frame 30 corresponding to the outer lead portion 17o through an adhesive 34 so as to surround the semiconductor chip 31.

It is possible to employ as the adhesive 34 a ductile, elastic adhesive having a satisfactory heat radiation, e.g., an polyolefin adhesive.

The semiconductor chip 31 is bonded at its rear surface directly to a bottom surface of the concave portion of the reinforcement plate 33 through a thermal-conductive paste 35.

After the semiconductor chip 31 is sealed by a resin 36, the lead frame 30 is cut at a position shown by chain lines 38 in FIG. 8H so that the joint portion 27 of the lead frame 30 should be removed.

Thus, an integrated circuit package 40 as shown in FIGS. 4 and 5 is obtained which has a structure of pins of a very large number where a large number of projecting electrodes 23 are formed in a grid fashion and which has a satisfactory heat radiation.

According to the method of manufacturing the integrated circuit package, since the metal base 11 is employed and the leads 17 and the projecting electrodes 23 are formed by electrolytic plating, the leads 17 can be formed in a finer pattern and the projecting electrodes 23 are prevented from being displaced. Moreover, each of the projecting electrodes 23 can have a uniform size and the pitch between the projecting electrodes 23 can be set finer, which leads to the LSI having a smaller size and the pins of a larger number.

According to this embodiment, since the metal base 11 is a laminated plate having a trilayer structure in which the aluminum film 13 and the nickel film 14 are successively formed on the copper substrate 12 and the leads 17 are formed on a surface of the nickel film 14 of the metal base 11 by copper plating, it is possible to selectively remove only the metal base 11 without any harmful influence to the leads 17 in the process of separating the leads 17 by etching the metal base 11 as shown in FIGS. 7F and 8G. Specifically, when the copper substrate 12 and the aluminum film 13 are removed by etching and the nickel film 14 is further removed by etching, the copper leads 17 are prevented from being etched by the etchant for the nickel film 14.

The selectivity of the etching described above prevents the nickel film 14 from remaining after the etching and can completely prevent short-circuit between the adjacent leads 17 resulting from the copper film 14 which was not removed by etching.

Figure 13A:
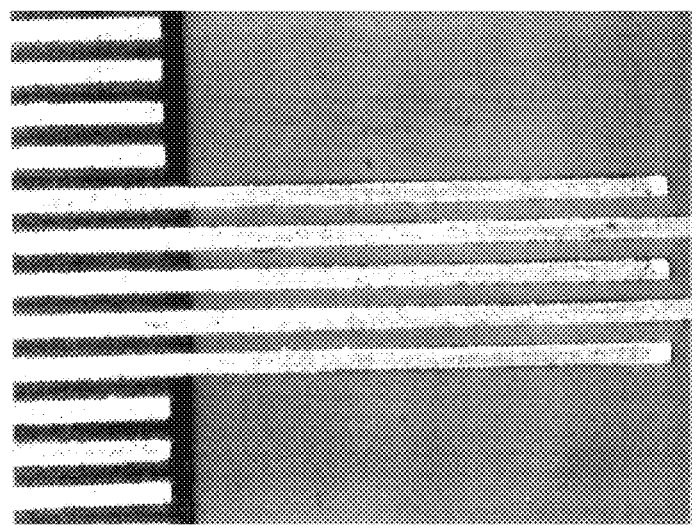
FIGS. 13A and 13B are respectively a photograph showing a fine lead pattern formed on a substrate of the integrated circuit package according to the embodiment of the present invention and an enlarged photograph thereof.
Figure 13B:
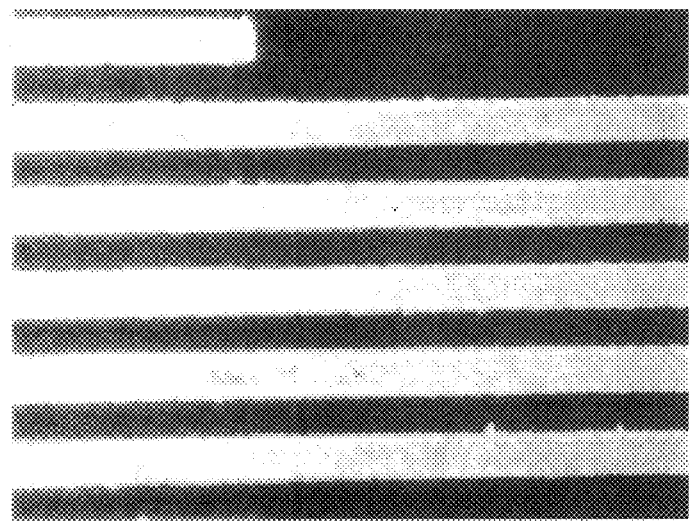

At the same time, since the copper leads 17 are not etched when the nickel film 14 is etched, the leads 17 are prevented from becoming thin unsatisfactorily. Specifically, as shown in FIGS. 13A and 13B which are photographs for evaluation, when the nickel film 14 is etched to form the leads 17 arranged at a pitch 70 $\mu$m (the standard lead width of 40 $\mu$m and the standard distance between adjacent leads of 30 $\mu$m), each of the leads 17 has the inner lead portion of the line width satisfying the standard and hence the leads 17 are prevented from becoming thin unsatisfactorily. Therefore, the leads 17 meting the standard sizes can be formed.

Figure 14A:
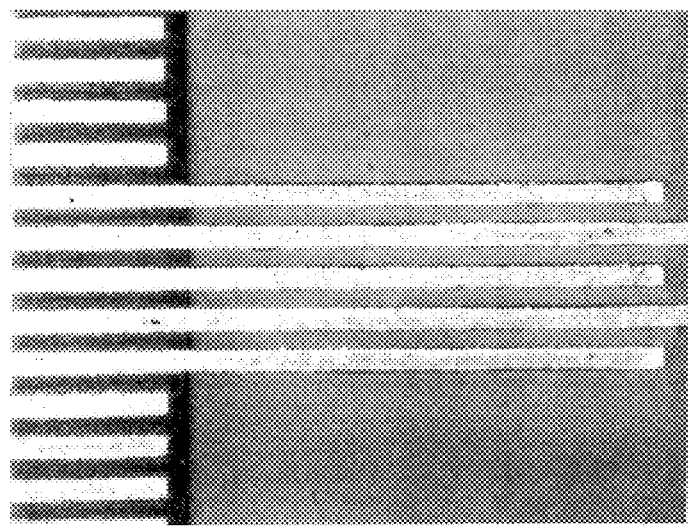
FIGS. 14A and 14B are respectively a photograph showing the fine lead pattern formed on the substrate when the nickel-film peeling time is set to seven minutes, and an enlarged photograph showing its main part.
Figure 14B:
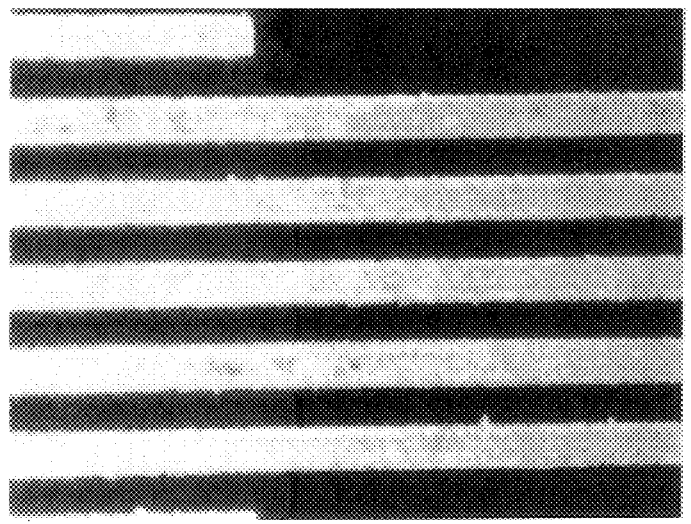
Figure 15A:
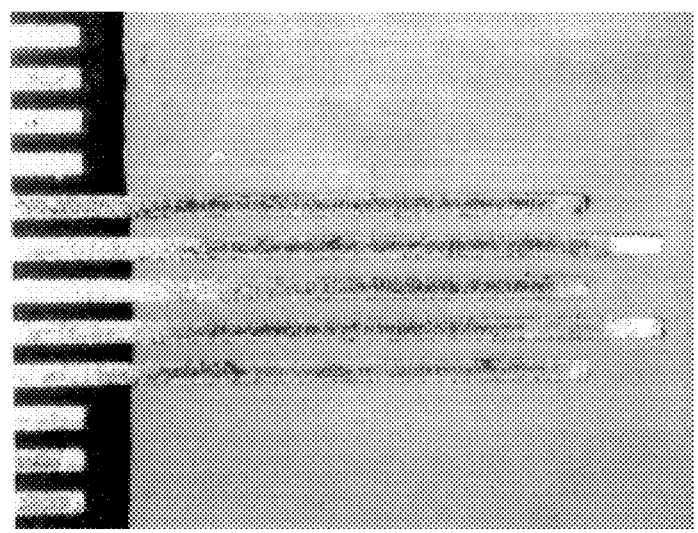
FIGS. 15A and 15B are respectively a photograph showing the fine lead pattern formed on the substrate when the nickel-film peeling time is set to thirty minutes, and an enlarged photograph showing its main part.
Figure 15B:
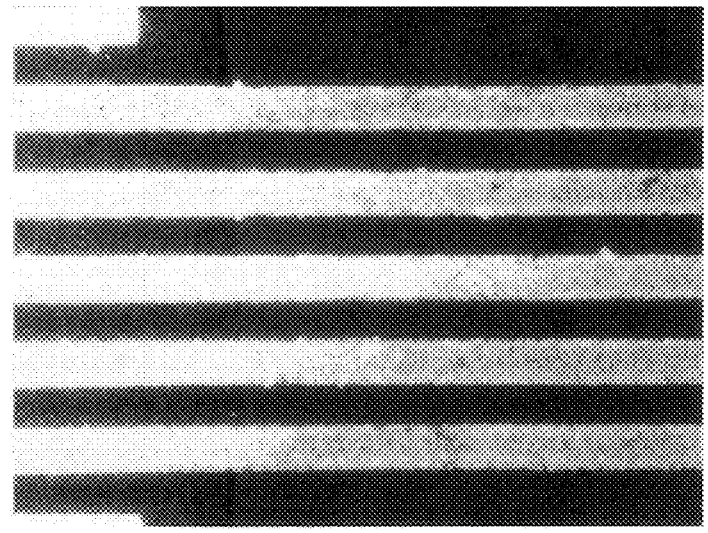

The etching selectivity can prevent over-etching from harmfully affecting the leads 17, which leads to fabrication of satisfactory products. Moreover, the etching selectivity allows a large work control width, which facilitates the work. Specifically, FIGS. 14A and 14B are photographs for evaluation, showing a pattern of the leads 17 when a peeling time of the nickel film 14 is set to 7 minutes. FIGS. 15A and 15B are photographs for evaluation, showing a pattern of the leads 17 when a peeling time of the nickel film 14 is set to 30 minutes. Study of FIGS. 14A, 14B, 15A and 15B reveals that the leads 17 are formed so as to have the same width and hence the work control width can be made larger.

Moreover, the etching selectivity allows the film thickness of the ground nickel film 14 to be set to 2 $\mu$m or larger, which improves a condition of forming the nickel film 14.

Figure 16:
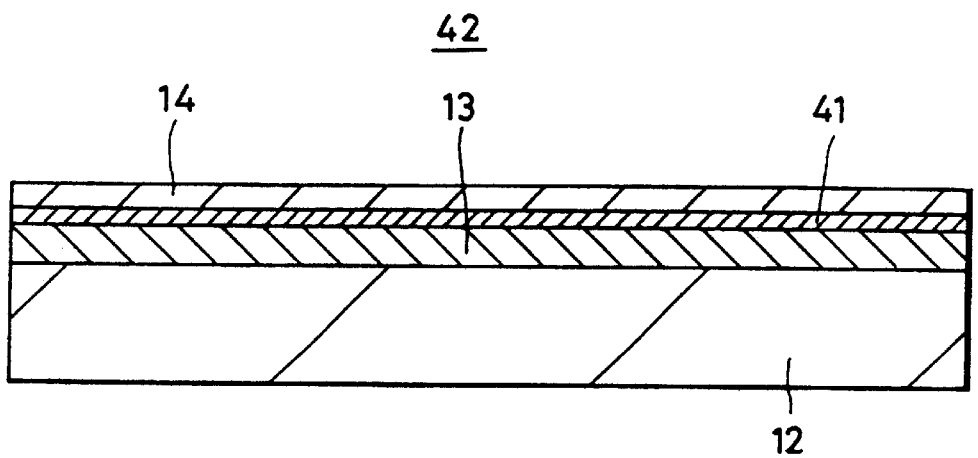
FIG. 16 is a cross-sectional view showing a metal base manufactured by e method of manufacturing the integrated circuit package according to the present invention.

While in this embodiment the metal base 11 having the trilayer structure in which the aluminum film 13 and the nickel film 14 are formed on the copper substrate 12 is employed as a metal base, the present invention is not limited thereto. A metal base 42 according to a second embodiment shown in FIG. 16 can be employed. The metal base 42 has a four-layer structure in which, as shown in FIG. 16, the aluminum film 13 with its thickness of about 4.5 $\mu$m, for example, a chromium film 41 with its thickness of about 0.5 $\mu$m, for example, and the nickel film 14 with its thickness of about 2 $\mu$m, for example are successively laminated on the copper substrate 12 with its thickness of about 150 $\mu$m, for example.

When the metal base 42 is employed, the chromium film 41 formed between the aluminum film 13 and the nickel film 14 reinforces the aluminum film 13 having a large number of pin holes and at the same time prevents a local battery formed of the aluminum film 13 and the nickel film 14 from being formed. Specifically, the chromium film 41 can prevent the aluminum film 13 from being corroded by the local battery.

Figure 17:
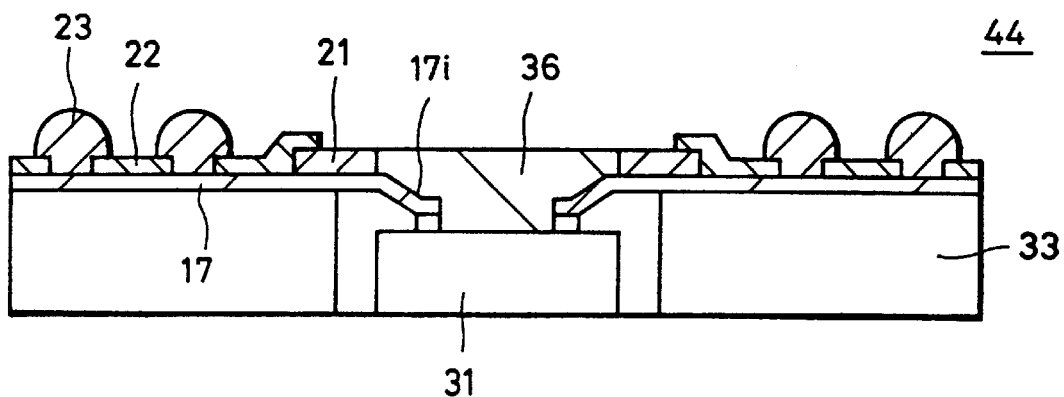
FIG. 17 is a cross-sectional view showing an integrated circuit package manufactured by the method of manufacturing the integrated circuit package according to the present invention.
Figure 18:
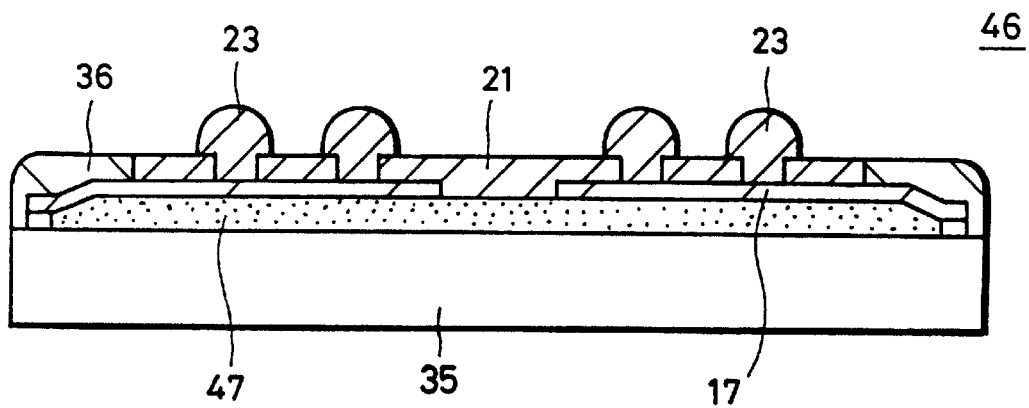
FIG. 18 is a cross-sectional view showing an integrated circuit package manufactured by the method of manufacturing the integrated circuit package according to the present invention.

FIGS. 17 and 18 are diagrams showing integrated circuit packages which can be manufactured by the manufacturing method according to the present invention. In FIGS. 17 and 18, like parts and portions corresponding to those of FIG. 4 are marked with the same reference numerals and hence need not to be described in detail.

An integrated circuit package 44 shown in FIG. 17 is arranged such that a frame-shaped reinforcement plate 33 is attached and the semiconductor chip 31 is sealed by the resin 36 for the rear surface of the semiconductor chip 31 to be exposed to the outside.

An integrated circuit package 46 shown in FIG. 18 does not includes the reinforcement plate 33. The semiconductor chip 31 is bonded to an entire rear surface of the leads 17 through an adhesive 47. The inner lead portions 17i of the leads 17 are bonded to the semiconductor chip 31. A peripheral portion of the semiconductor chip 31 are sealed by the resin 36. Thus, the integrated circuit package 46 is formed.

In this integrated package 46, the semiconductor chip 31 serves also as a reinforcement plate.

The integrated circuit package 44 can be manufactured by manufacturing processes similar to those shown in FIGS. 6A to 6C, 7D to 7F and 8G to 8I. The integrated circuit package 46 is manufactured such that the inner lead portions 17i and the outer lead portions 17o are located at the opposite positions. Specifically, the lead 17 having the outer lead portion 17o on the inner side and the inner lead portion 17i on the outer side is formed. Except this arrangement, the integrated circuit package 46 can be manufactured by manufacturing processes similar to those shown in FIGS. 6A to 8H.

According to the method of manufacturing the integrated circuit package of the present invention, since the metal base 11 in which the aluminum film 13 and the nickel film 14 are successive laminated on the copper or copper-alloy substrate is employed and a plurality of leads 17 are formed by copper plating on the surface of the nickel film 14 of the metal base 11, the etching selectivity with respect to the nickel film 14 and the copper leads 17 can be obtained, and when the respective leads 17 are separated by removing the metal base 11 by etching, it is possible to selectively remove only the metal base 11 without any harmful influence on the leads 17.

Specifically, the above etching selectivity brings a larger word control width (see FIGS. 14A, 14B, 15A and 15B which are photographs), which facilitates the manufacturing processes.

The etching selectivity can completely prevent the adjacent leads 17 from being short circuited because it can prevent some of the nickel film 14 from remaining after the etching, and can completely prevent the lead from becoming thin unsatisfactorily (see FIGS. 13A, 13B).

When the nickel film 14 is etched, even if the nickel film 14 is over-etched, then the etching selectivity allows satisfactory integrated circuit packages to be manufactured. Moreover, the etching selectivity allows the film thickness of the ground nickel film 14 to be set 2 $\mu$m or larger, which improves the condition of forming the nickel film 14.

According to the method of manufacturing the integrated circuit package of the present invention, since the metal base 41 in which the aluminum film 13, the chromium film 41 and the nickel film 14 are successively laminated on the copper or copper alloy substrate 12 is employed, the chromium film 41 reinforces the aluminum film 13 having a large number of pin holes, and the chromium film 41 prevents the local battery between the aluminum film 13 and the nickel film 14 from being generated, which can prevent the aluminum film 13 from being corroded.

Therefore, according to the present invention, it is possible to form the leads 17 in a fine pattern with accuracy, and it is possible to easily manufacture, with high accuracy, the integrated circuit package having the high density structure with the pins of the very large number.

Having described a preferred embodiment of the present invention with reference to the accompanying drawings, it is to be understood that the present invention is not limited to the above-mentioned embodiment and that various changes and modifications can be effected therein by one skilled in the art without departing from the spirit or scope of the present invention as defined in the appended claims.

What is claimed is:

1. A method of manufacturing a plurality of leads for a semiconductor chip package comprising the steps of:

providing a metal base having a nickel layer, a copper layer and at least an intermediate layer of aluminum between the nickel and copper layers;

copper plating a plurality of leads, each having an inner lead portion and an outer lead portion, on the nickel layer, which is used as a ground for forming the leads;

forming an insulative holding film on a portion of each of said plurality of leads, said insulative holding film exposing a portion of each of the outer lead portions of each lead;

forming a projecting electrode on the exposed portion of each outer lead portion of said plurality of leads; and selectively removing the copper layer of the metal base, then removing at least said intermediate layer of aluminum without etching the nickel layer followed by selectively etching the nickel layer without etching the plurality of leads.

2. The method of manufacturing according to claim 1, wherein the step of providing the base metal provides a chromium layer between the intermediate layer of aluminum and said nickel layer and said step of removing at least said intermediate layer of aluminum removes both said chromium layer and the layer of aluminum.

3. The method of manufacturing according to claim 1, wherein the step of providing the nickel layer plates the nickel layer on the intermediate layer.

4. The method of manufacturing according to claim 1, wherein the step of forming projecting electrode includes forming a ground metal film on a pad portion formed on an exposed portion of the outer lead portion of each lead, forming a solder on said ground metal film and then reflowing said solder to be at least substantially ball-shaped.

5. The method of manufacturing according to claim 1, wherein the step of etching the nickel layer includes masking the nickel layer to leave a bump on an inner lead portion of each of said leads.

6. A method of manufacturing an integrated circuit package comprising the steps of:

providing a metal base having a nickel layer, a copper layer and at least an intermediate layer of aluminum between the copper and the nickel layers;

copper plating a plurality of leads having inner lead portions and outer lead portions on the nickel layer, which is used as a ground for forming said leads;

forming an insulative holding film on a portion of said plurality of leads, said insulative holding film exposing at least a portion of each outer lead portion;

forming a projecting electrode on the exposed portion of each outer lead portion of said plurality of leads;

separating said respective leads by first selectively etching the copper layer of the metal base, then selectively etching at least said intermediate layer of aluminum and then etching the nickel layer without etching the plurality of leads; and then joining the inner lead portions of said leads to a semiconductor chip.

7. The method of manufacturing according to claim 6, wherein the step of providing the metal base includes providing an intermediate chromium layer between at least said intermediate layer of aluminum and the nickel layer and said step of etching at least said intermediate layer of aluminum includes etching at least said intermediate layer of aluminum and then selectively etching the chromium layer.

8. The method of manufacturing according to claim 6, which includes, after the step of joining the inner leads to a semiconductor chip, joining a member for housing said semiconductor chip to an outer lead portion by a ductile and elastic adhesive.

9. The method of manufacturing according to claim 6, wherein the step of etching the nickel layer includes leaving a bump on each of the inner lead portions.

* * * * *